(12) United States Patent
Ghosh et al.

(10) Patent No.: US 9,818,466 B2
(45) Date of Patent: Nov. 14, 2017

(54) ROBUST SLOPE DETECTION TECHNIQUE FOR STTRAM AND MRAM SENSING

(71) Applicants: Swaroop Ghosh, Tampa, FL (US); Seyedhamidreza Motaman, Tampa, FL (US)

(72) Inventors: Swaroop Ghosh, Tampa, FL (US); Seyedhamidreza Motaman, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 15/198,934

(22) Filed: Jun. 30, 2016

(65) Prior Publication Data

US 2017/0004868 A1  Jan. 5, 2017

Related U.S. Application Data

(60) Provisional application No. 62/186,894, filed on Jun. 30, 2015.

(51) Int. Cl.
| | | |
|---|---|---|
| *G11C 11/00* | (2006.01) | |
| *G11C 11/16* | (2006.01) | |
| *G11C 27/02* | (2006.01) | |

(52) U.S. Cl.
CPC ...... *G11C 11/1673* (2013.01); *G11C 11/1677* (2013.01); *G11C 11/1693* (2013.01); *G11C 27/024* (2013.01); *G11C 2213/15* (2013.01)

(58) Field of Classification Search
CPC .......................................... G11C 11/14–11/16
USPC .................................. 365/158, 171, 173, 148
See application file for complete search history.

(56) References Cited

U.S. PATENT DOCUMENTS

| | | | |
|---|---|---|---|
| 7,889,585 B2 | 2/2011 | Jung et al. | |
| 8,547,738 B2 | 10/2013 | Banna et al. | |
| 8,576,631 B2 | 11/2013 | Daga | |
| 8,665,638 B2 | 3/2014 | Rao et al. | |
| 2007/0152650 A1* | 7/2007 | Sheu ...................... | B82Y 10/00 324/76.11 |
| 2007/0171732 A1* | 7/2007 | Lin ........................ | B82Y 10/00 365/189.14 |
| 2010/0110764 A1* | 5/2010 | Sun ........................ | G11C 11/16 365/148 |
| 2014/0035662 A1 | 2/2014 | Kang | |
| 2015/0048854 A1* | 2/2015 | Fornage .................. | H02S 50/00 324/713 |

OTHER PUBLICATIONS

Hosomi et al., "A novel nonvolatile memory with spin torque transfer magnetization switching: spin-RAM," *IEDM*, 2005.

(Continued)

*Primary Examiner* — Han Yang
(74) *Attorney, Agent, or Firm* — Saliwanchik, Lloyd & Eisenschenk

(57) ABSTRACT

Slope detection systems and methods are provided that monitor magnetic tunnel junction (MTJ) resistance switching. A low-overhead, sample-and-hold circuit can be used. Slope detection techniques can reduce or eliminate bit-to-bit process variation, thereby reducing or eliminating variation in oxide thickness. In addition, the need for data and reference current can be obviated compared to related art techniques, thereby increasing sensing robustness.

17 Claims, 12 Drawing Sheets

(56) References Cited

OTHER PUBLICATIONS

Song et al., "Sensing margin trend with technology scaling in MRAM," *International Journal of Circuit Theory and Applications*, 2011, pp. 313-325, vol. 39.

Sun et al., "Voltage driven nondestructive self-reference sensing scheme of spin-transfer torque memory," *IEEE Transactions on Very Large Scale Integration (VLSI) Systems*, Nov. 2012, pp. 2020-2030, vol. 20, No. 11.

Halupka et al., "Negative-resistance read and write schemes for STT-MRAM in 0.13µm CMOS," *International Solid-State Circuits Conference*, Feb. 9, 2010, pp. 256-258, Session 14.

Ren et al., "A body-voltage-sensing-based short pulse reading circuit for spin-torque transfer RAMs (STT-RAMs)," *International Symposium on Quality Electronic Design*, 2012, pp. 275-282, No. 13.

Emre et al., "Enhancing the reliability of STT-RAM through circuit and system level techniques," *SiPS*, 2012.

Jeong et al., "A 0.24-µm 2.0-V 1T1MTJ 16-kb nonvolatile magnetoresistance RAM with self-reference sensing scheme," *IEEE Journal of Solid-State Circuits*, Nov. 2003, pp. 1906-1910, vol. 38, No. 11.

Chen et al., "A 130 nm 1.2 V/3.3 V 16 Kb spin-transfer torque random access memory with nondestructive self-reference sensing scheme," *IEEE Journal of Solid-State Circuits*, Feb. 2012, pp. 560-573, vol. 47, No. 2.

Predictive technology model, ASU, http://ptm.asu.edu.

Kim et al., "STT-MRAM sensing circuit with self-body biasing in deep submicron technologies," *IEEE Transactions on Very Large Scale Integration (VLSI) Systems*, Jul. 2014, pp. 1630-1634, vol. 22, No. 7.

Au et al., "A novel current-mode sensing scheme for magnetic tunnel junction MRAM," *IEEE Transactions on Magnetics*, Mar. 2004, pp. 483-488, vol. 40, No. 2.

Pelgrom et al., "Matching properties of MOS transistors," *IEEE Journal of Solid-State Circuits*, Oct. 1989, pp. 1433-1440, vol. 24, No. 5.

Hadidi et al., "A novel highly linear CMOS buffer," *IEEE International Conference on Electronics, Circuits and Systems*, 1998, pp. 369-371, vol. 3.

Chen et al., "A nondestructive self-reference scheme for spin-transfer torque random access memory (STT-RAM)," *Design, Automation & Test in Europe Conference & Exhibition*, 2010.

Durlam et al., "Nonvolatile RAM based on magnetic tunnel junction elements," *IEEE International Solid-State Circuits Conference, Digest of Technical Papers*, 2000.

\* cited by examiner

ROBUST SLOPE DETECTION TECHNIQUE FOR STTRAM AND MRAM SENSING

CROSS-REFERENCE TO A RELATED APPLICATION

This application claims the benefit of U.S. Provisional Application Ser. No. 62/186,894, filed Jun. 30, 2015, the disclosure of which is hereby incorporated by reference in its entirety, including all figures, tables and drawings.

BACKGROUND OF THE INVENTION

Spin-Torque Transfer Random Access Memory (STTRAM) is a useful memory technology for embedded cache due to high-density, low standby power, and high speed [1]. STTRAM provides high density due to a 1T-1R structure and can eliminate bitcell leakage due to the non-volatile nature of the storage element, which is a magnetic tunnel junction (MTJ). Referring to FIG. 1(a), the MTJ can contain a free layer and a pinned magnetic layer. The resistance of the MTJ stack is high if the free layer magnetic orientation is anti-parallel compared to the fixed layer, and the resistance of the MTJ stack is low if the free layer magnetic orientation is parallel compared to the fixed layer. The configuration of the MTJ can be changed from parallel to antiparallel, or vice versa, by injecting current from the source-line to the bitline, or vice versa. The spin-torque transfer phenomena for reversal of magnetization in a free layer reduce the write power compared to conventional Magnetic Random Access Memory (MRAM). The memory array can contain a circuit to sense the orientation of the free magnetic layer compared to fixed layer.

Challenges involved in STTRAM include high write current, long write time, and poor sense margin (SM). Sense margin of STTRAM depends on the tunnel magnetic ratio (TMR), which is defined as $100*(R_H R_L/R_L)$ where $R_L$ and $R_H$ are low and high resistance, respectively, of the MTJ. Due to a poor TMR, the voltage/current differential between $R_H$ and $R_L$ can decrease, which can degrade the SM. In addition, SM is asymmetric in nature, meaning that SM0 and SM1 are not identical [6]. FIG. 2 is a chart showing the taxonomy of various sensing techniques. Referring to FIG. 2, STTRAM sensing can be broadly categorized into destructive and non-destructive sensing. Several non-destructive sensing techniques exist, including a nondestructive voltage sensing and sizing methodology to improve the SM of MRAM arrays, as well as a source degeneration scheme to reduce large SM variation [2, 3, 4, 5, 6, 8, 11, 12, 13]. Even though the read latency and power can be reduced using certain techniques, for example by eliminating two write steps, the SM is much smaller than with destructive self-reference schemes and conventional nondestructive voltage sensing.

A destructive (self-reference) sensing technique exits that can eliminate bit-to-bit process variation in MTJ resistance [7]. Sensing is performed by first storing the voltage of the MTJ by passing a current ($I_1$), and then after a time interval storing a reference voltage of the same MTJ after passing another current ($I_2$). The variation in MTJ resistance can be eliminated by this self-reference sensing scheme. Although this mechanism can provide better SM and decrease the need for reference voltage, it incurs high power consumption and long read latency due to two write steps.

BRIEF SUMMARY OF THE INVENTION

Embodiments of the subject invention provide advantageous slope detection systems and methods that exploit magnetic tunnel junction (MTJ) resistance switching from a high- to a low-resistance state (or vice versa). A low-overhead, sample-and-hold circuit can be used. Slope detection techniques of the subject invention can reduce or eliminate bit-to-bit process variation, thereby reducing or eliminating variation in oxide thickness. In addition, the need for data and reference current can be obviated compared to related art techniques, thereby increasing sensing robustness. Multiple sampling, such as double sampling (triple sampling, etc.), can be used to increase the robustness even further.

In an embodiment, a method for detecting the slope of a current-voltage (I-V) curve of memory can include: injecting a ramp current into an MTJ of the memory; monitoring the resistance of the MTJ of the memory; if the resistance of the MTJ switches from a low-resistance state to a high-resistance state, determining that the slope of the I-V curve has changed from negative to positive; and, if the resistance of the MTJ switches from a high-resistance state to a low-resistance state, determining that the slope of the I-V curve has changed from positive to negative. The monitoring step and/or the determining steps can be performed by a circuit. Such a circuit can include a sample-and-hold circuit, a sense amplifier circuit, or both, though embodiments are not limited thereto. Such a circuit can include a ramp current source circuit, an input buffer circuit, or both, though embodiments are not limited thereto. The memory can be, for example, Spin-Torque Transfer Random Access Memory (STTRAM) or Magnetic Random Access Memory (MRAM), though embodiments are not limited thereto. Single or multiple sampling (e.g., double sampling) can be performed.

In another embodiment, a method for detecting the state of a current of memory can include: monitoring the resistance of an MTJ of the memory; if the resistance of the MTJ switches from a low-resistance state to a high-resistance state, determining that the current is negative; and, if the resistance of the MTJ switches from a high-resistance state to a low-resistance state, determining that the current is positive. The monitoring step and/or the determining steps can be performed by a circuit. Such a circuit can include a sample-and-hold circuit, a sense amplifier circuit, or both, though embodiments are not limited thereto. Such a circuit can include a ramp current source circuit, an input buffer circuit, or both, though embodiments are not limited thereto. The memory can be, for example, STTRAM or MRAM, though embodiments are not limited thereto. Single or multiple sampling (e.g., double sampling) can be performed.

In another embodiment, a system for detecting the state of a current of memory can include a circuit configured to: inject a ramp current into an MTJ of the memory; monitor the resistance of an MTJ of the memory; if the resistance of the MTJ switches from a low-resistance state to a high-resistance state, determining that the slope of the I-V curve has changed from negative to positive; and, if the resistance of the MTJ switches from a high-resistance state to a low-resistance state, determining that the slope of the I-V curve has changed from positive to negative. The circuit can include a sample-and-hold circuit, a sense amplifier circuit, or both, though embodiments are not limited thereto. The circuit can include a ramp current source circuit, an input buffer circuit, or both, though embodiments are not limited thereto. The memory can be, for example, STTRAM or MRAM, though embodiments are not limited thereto.

In yet another embodiment, a system for detecting the state of a current of memory can include a circuit configured to: monitor the resistance of an MTJ of the memory; if the resistance of the MTJ switches from a low-resistance state to a high-resistance state, determine that the current is negative; and, if the resistance of the MTJ switches from a high-resistance state to a low-resistance state, determine that the current is positive. The circuit can include a sample-and-hold circuit, a sense amplifier circuit, or both, though embodiments are not limited thereto. The circuit can include a ramp current source circuit, an input buffer circuit, or both, though embodiments are not limited thereto. The memory can be, for example, STTRAM or MRAM, though embodiments are not limited thereto.

DETAILED DESCRIPTION OF THE INVENTION

Embodiments of the subject invention provide advantageous slope detection systems and methods that exploit magnetic tunnel junction (MTJ) resistance switching from a high- to a low-resistance state (or vice versa). A low-overhead, sample-and-hold circuit can be used. Slope detection techniques of the subject invention can reduce or eliminate bit-to-bit process variation, thereby reducing or eliminating variation in oxide thickness. In addition, the need for data and reference current can be obviated compared to related art self-reference sensing techniques, and sensing robustness can therefore be increased compared to related art techniques. Multiple sampling, such as double sampling (triple sampling, etc.), can be used to increase the robustness even further, though a potential cost for multiple sampling can be extra area overhead compared to single sampling or possibly to self-reference sensing. Simulation results, which will be discussed in the Examples, reveal <0.12% failure under process variation using single sampling (at 0.2% area overhead) and <0.08% failures with double sampling (at 0.6% area overhead). The overall sense time can be 10 nanoseconds (ns) or less (for example, 7 ns).

MTJ resistance switches from low to high when current is negative and greater than a critical current in magnitude, and the MTJ switches from high to low when current is positive and greater than a critical current in magnitude. Embodiments of the subject invention can thus correlate the current state of the MTJ to the switching behavior. For example, if the MTJ resistance is low, it may only switch with negative current. The resistance can remain low for positive current. Similarly, if the MTJ resistance is high, it may only switch with positive current. The resistance can remain high for negative current. The subject invention can advantageously exploit this property in order to detect the current state of an MTJ (e.g., an MTJ of Spin-Torque Transfer Random Access Memory (STTRAM)).

Figures 1A, 1B:
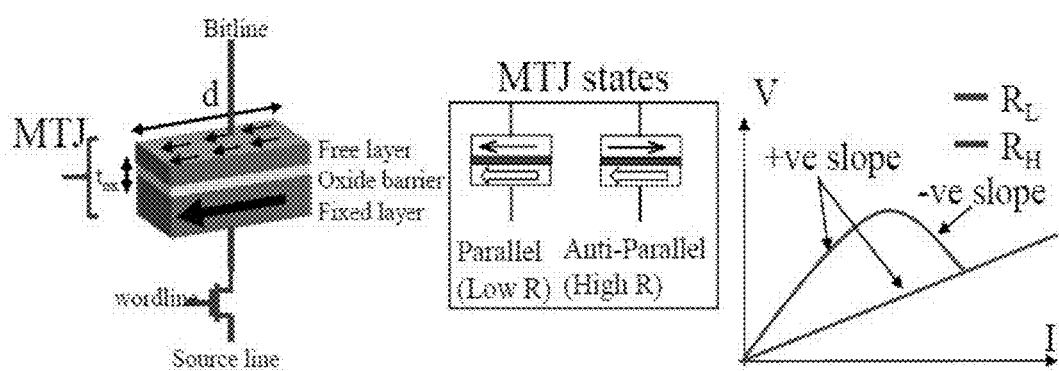
FIG. 1(a) shows a schematic of Spin-Torque Transfer Random Access Memory (STTRAM).
FIG. 1(b) shows a current-voltage curve of a magnetic tunnel junction (MTJ).
Figure 2:
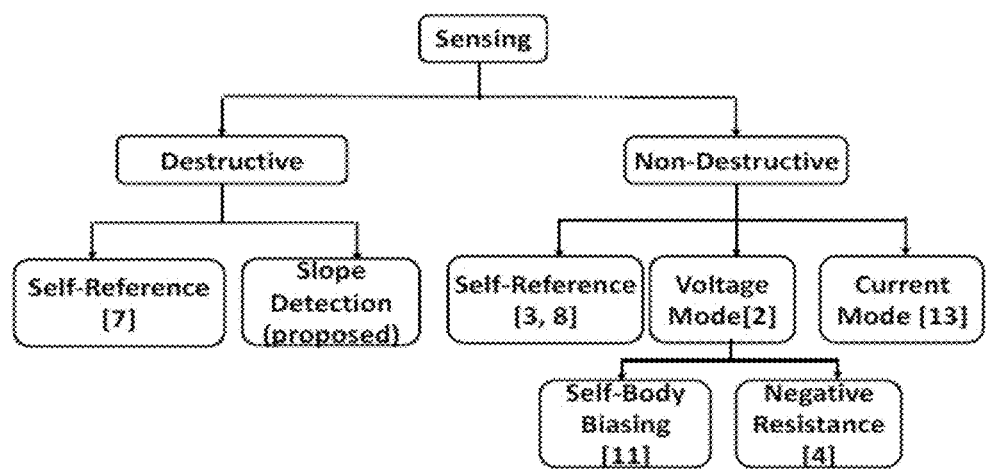
FIG. 2 shows a chart of STTRAM sensing schemes.

In addition, referring to FIG. 1(b), the slope of a current-voltage (I-V) curve changes from positive to negative during switching of the resistance. Embodiments of the subject invention provide systems and techniques for sensing the slope change of an I-V curve in order to detect the state (e.g., the state of the current) of an MTJ (e.g., an MTJ of STTRAM). In many embodiments, the sensing scheme can be a destructive sensing scheme, and therefore restoration of state may be required after a read operation. In some embodiments, a ramp current can be injected into the MTJ, which can result in a voltage with either a positive or negative slope based on the MTJ resistance state (see, e.g., FIG. 1(b)). This technique advantageously eliminates the need for determining data and reference current.

Embodiments of the subject invention provide systems and methods for slope detection using sampling techniques in order to detect MTJ resistance (e.g., when such resistance switches from a high- to a low-resistance state). The slope detection can be destructive slope detection, though embodiments are not necessarily limited thereto. Process variation analysis can be used to demonstrate the robustness of slope detection techniques according to embodiments of the subject invention. In some embodiments, a double (or more) sampling technique can be used to improve the robustness and sense margin, with a possible cost of using two (or more) sense amplifiers. Process variation analysis can be performed on nondestructive and destructive sensing.

Figure 8A:
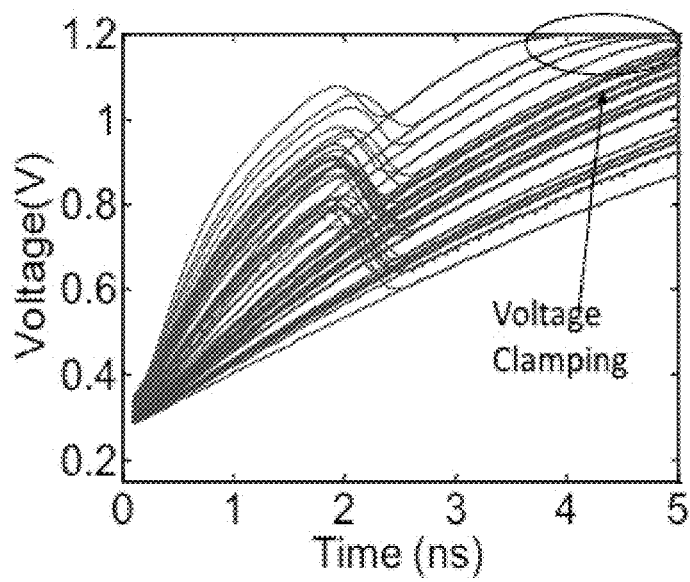
FIG. 8(a) shows a voltage-time curve.
Figure 8B:
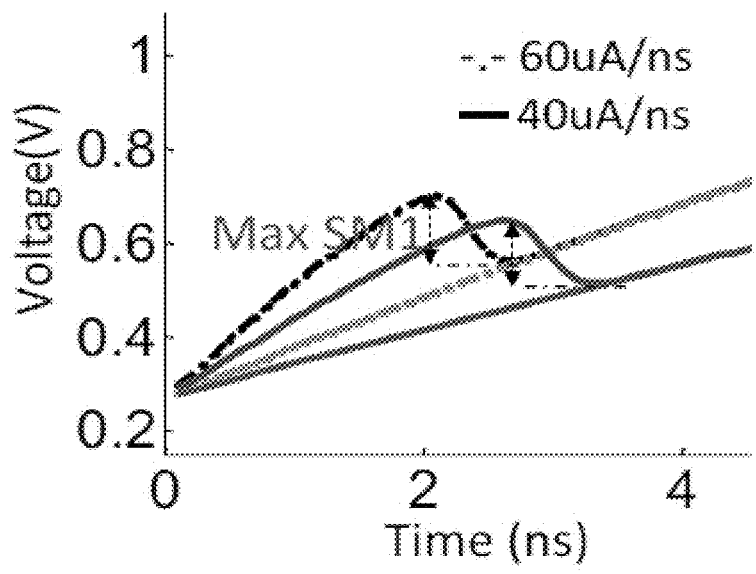
FIG. 8(b) shows a voltage-time curve.

In an embodiment, a slope detection sensing scheme can include injecting a ramp current into a bitcell, which can result in a ramp voltage. The slope of the voltage can change from positive to negative if the MTJ resistance is switched from a high- to a low-resistance state, as shown in the voltage-time (V-T) curve in FIG. 8. Sensing can be simplified to slope detection. If a negative slope is detected, then the data can be sensed as 1, else the data can be sensed as 0. In some embodiments, SM1 can be limited to Max SM1, which is the difference between the peak of the V-T curve and the minimum voltage after flipping (FIG. 8). The maximum SM1 can vary with respect to current slope. Furthermore, the slope of the voltage can increase with higher current slope.

Figures 9A, 9B:
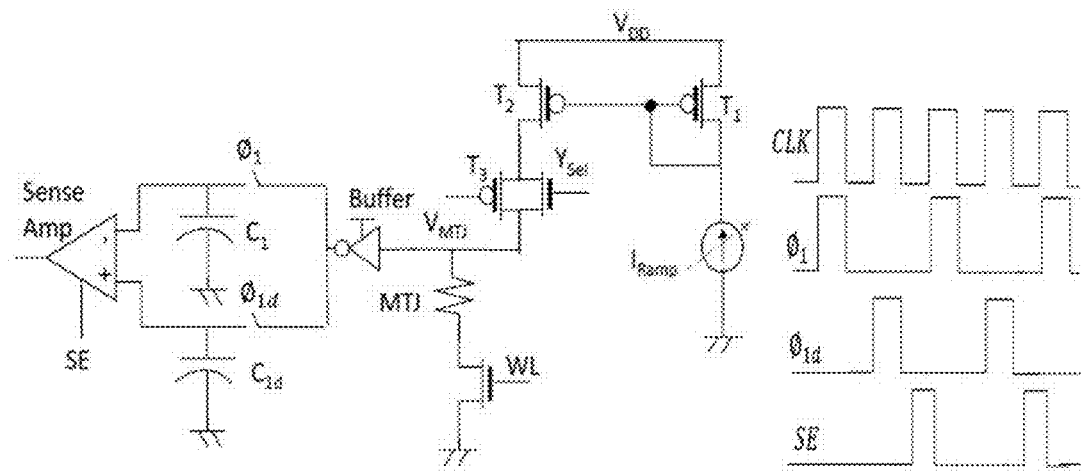
FIG. 9(a) shows a circuit diagram for a sensing scheme according to an embodiment of the subject invention.
FIG. 9(b) shows a timing diagram for a sensing scheme according to an embodiment of the subject invention.

FIG. 9(a) shows a circuit diagram for a slope detection sensing scheme according to an embodiment of the subject invention, and FIG. 9(b) shows a timing diagram. $V_{MTJ}$ can be sampled at $\varnothing_1$ and $\varnothing_{1d}$, and sampled voltages can be stored in $C_1$ and $C_{1d}$, respectively. The $C_1$ and $C_{1d}$ voltages can be compared at the edge of SE. Referring to FIG. 9, the voltage across the bitcell (VMTJ) can be clamped at $V_{DD}$-$V_{od2}$ (overdrive voltage of transistor $T_2$)-\$T_{od3}$ (overdrive voltage of transistor $T_3$). Therefore, even with high current slope, the voltage across the bitcell may not increase beyond a certain voltage, which in turn reduces the voltage slope and SM. MTJ flipping time can also vary with current slope. For example, higher current slope can result in faster flipping time.

In an embodiment, slope detection can be performed by sampling the ramp voltage with two sample-and-hold circuits using clocks $\phi_1$ and $\phi_{1d}$ (delayed version of $\phi_1$). Then sampled voltages can be stored in $C_1$ and $C_{1d}$, respectively. Then, $V_{C1}$ and $V_{C1d}$ can be compared using a sense amplifier when sense amplifier enable (SE) turns ON.

Figure 10:
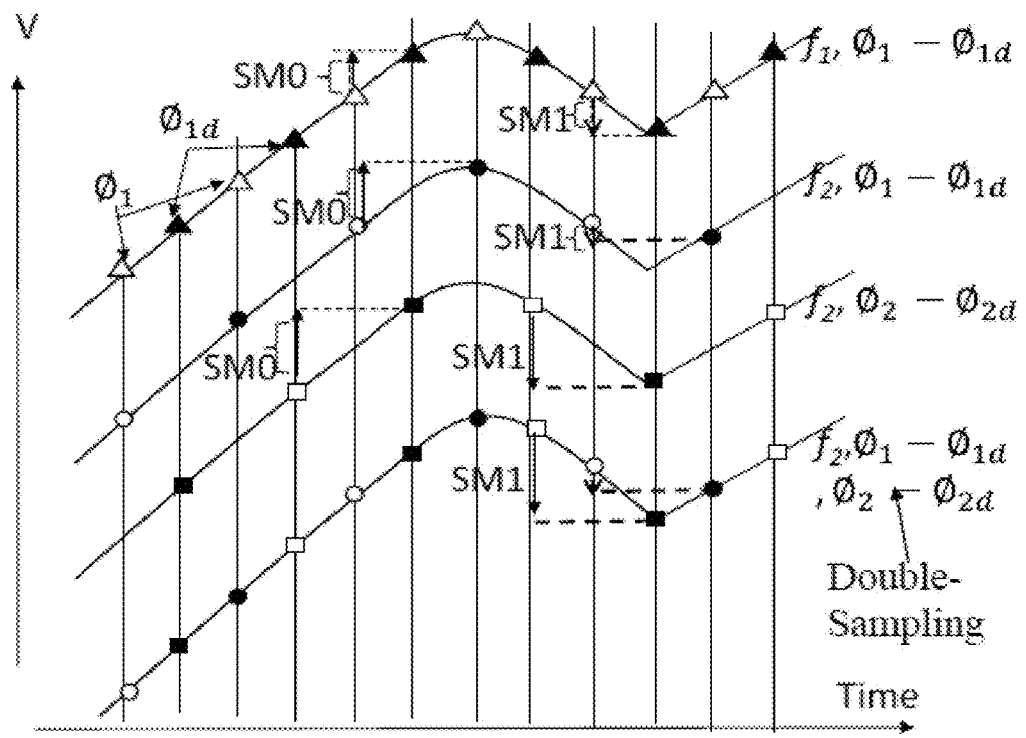
FIG. 10 shows a diagram of sample and hold behavior with two sampling frequencies.

FIG. 10 shows a diagram of sample and hold behavior with two sampling frequencies $f_1$ and $f_2$ (e.g., $f_2=f_1/2$). The diagram in FIG. 10 can clarify the technique for two sampling frequencies. Referring to FIG. 10, white triangles represent the voltages sampled by $\phi_1$, and black triangles represent the voltages sampled by $\phi_{1d}$. The sense amplifier can be enabled after the black triangles. As a result, two consecutive black and white triangle voltages can be compared. SM is positive in the positive slope region, and SM is negative in the negative slope region.

Figure 11A:
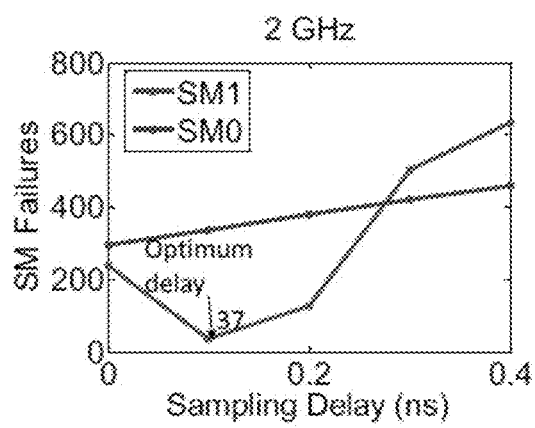
FIG. 11(a) shows a plot of sense margin (SM) failures.
Figure 11B:
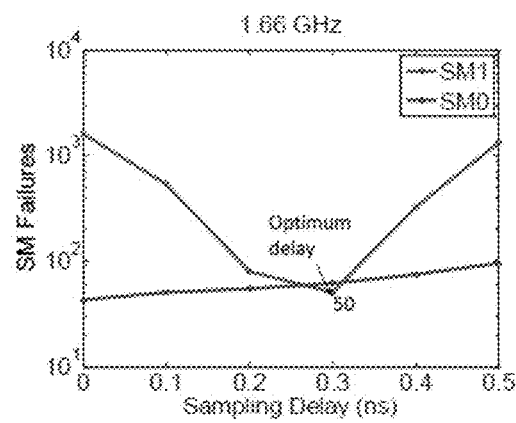
FIG. 11(b) shows a plot of SM failures.

The amount of SM1 that can be obtained can depend on sampling delay (i.e., sampling starting time), sampling frequency, and slope of ramp current. Because different bitcells can experience different flipping time due to process variation, there can be an optimum sampling delay that minimizes SM1 failures for each particular sampling frequency as shown in the plot in FIG. 11(a). Referring again to FIG. 10, sampling with frequency $f_2$, $\phi_1$-$\phi_{1d}$, can lead to a poor SM1 while sampling with frequency $f_2$, $\phi_2$-$\phi_{2d}$ ($\phi_2$ is delayed version of $\phi_1$) can provide a large SM1. However, the voltage across MTJ can increase monotonically when MTJ resistance is low. Therefore, referring to the plot of FIG. 11(b), sampling delay does not affect SM0 significantly. FIG. 11(a) shows SM failures (50 mV senseamp offset is considered) with respect to sampling delay for a frequency of 2 gigahertz (GHz), and FIG. 11(b) shows SM failures (50 mV senseamp offset is considered) with respect to sampling delay for a frequency of 1.66 GHz.

Figure 12A:
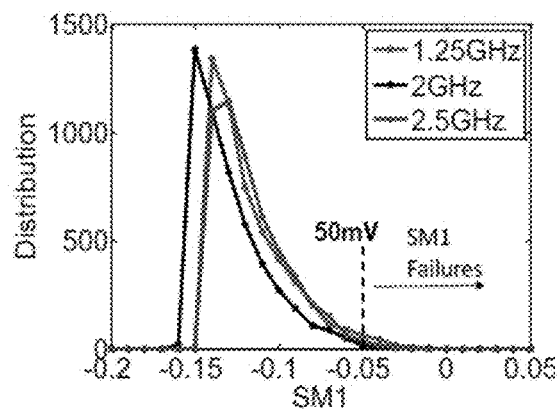
FIG. 12(a) shows a plot of SM distribution.
Figure 12B:
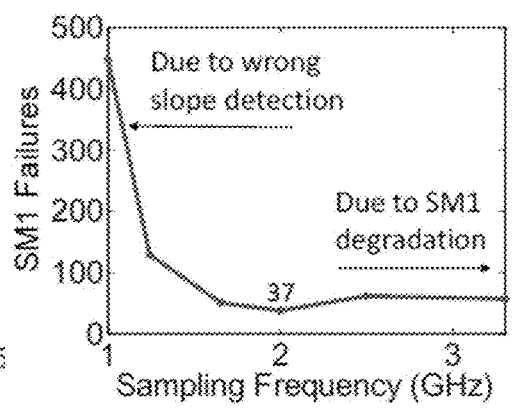
FIG. 12(b) shows a plot of SM failures.
Figure 12C:
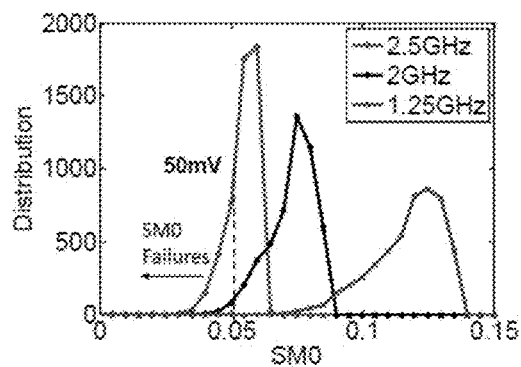
FIG. 12(c) shows a plot of SM distribution.
Figure 12D:
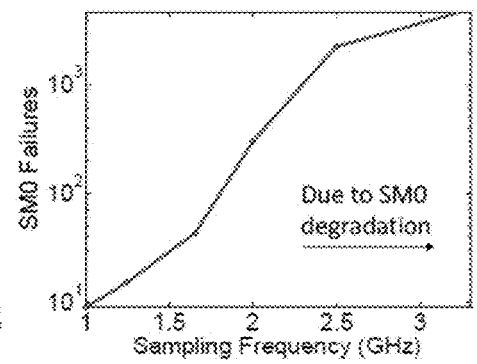
FIG. 12(d) shows a plot of SM failures.

Lower sampling frequency can result in a higher SM0 because the voltage difference of two consecutive samples is higher. However, increasing sampling frequency can potentially cause an error in negative slope detection due to poor SM1. As shown in FIG. 10, sampling with frequency $f_2$ (where $f_2=f_1/2$), $\phi_1$-$\phi_{1d}$ clock phases, can fail to detect the negative slope and provide poor SM1 after MTJ flipping, and sampling with frequency $f_1$ can provide a larger SM1. FIG. 12(a) shows the SM1 distribution for 5000 monte-carlo points for different sampling frequency with optimum sampling delay, and FIG. 12(c) shows the SM0 distribution for 5000 monte-carlo points for different sampling frequency with optimum sampling delay. FIG. 12(b) shows SM1 failures with respect to sampling frequency (50 mV senseamp offset is considered), and FIG. 12(d) shows SM0 failures with respect to sampling frequency (same offset). Referring to FIG. 12(b), sampling with 2 GHz (optimum frequency) can result in a minimum (or at least low) number of failures (37 out of 5000). Increasing the sampling frequency can result in more sensing failures due to sense margin degradation, and decreasing the sampling frequency can result in more sensing failures due to incorrect slope detection.

Figure 13A:
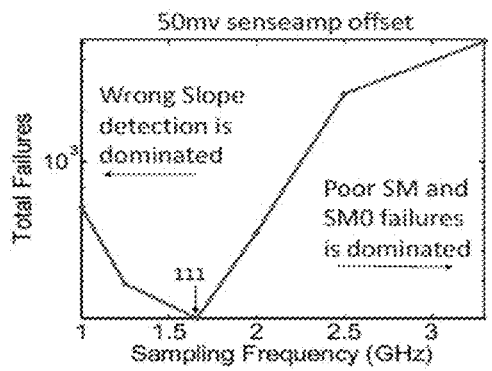
FIG. 13(a) shows a plot of SM failures.
Figure 13B:
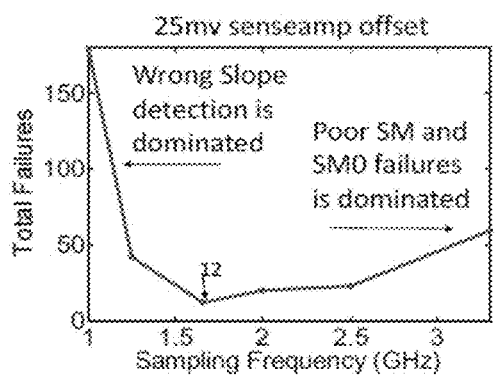
FIG. 13(b) shows a plot of SM failures.

Referring to FIG. 12(c), reducing sampling frequency can increase the mean value of SM0 distribution, which in turn can reduce SM0 failures. Positive slope (SM0) was detected several times during sense operation; thus, SM0 can be at a minimum during sensing. By increasing sampling frequency SM1 failures can be minimized at a particular frequency (2 GHz) while SM0 failures can be increased. FIG. 13(a) shows a plot of total sensing failures for 10000 monte-carlo points for 50 mV senseamp offset for a ramp current slope of 50 μA/ns, and FIG. 13(b) shows a plot of total sensing failures for 10000 monte-carlo points for 25 mV senseamp offset for a ramp current slope of 50 μA/ns. Referring to FIGS. 13(a) and 13(b), simulations indicate that total failures can be minimized at a sampling frequency of 1.66 GHz or about 1.66 GHz.

Figure 14:
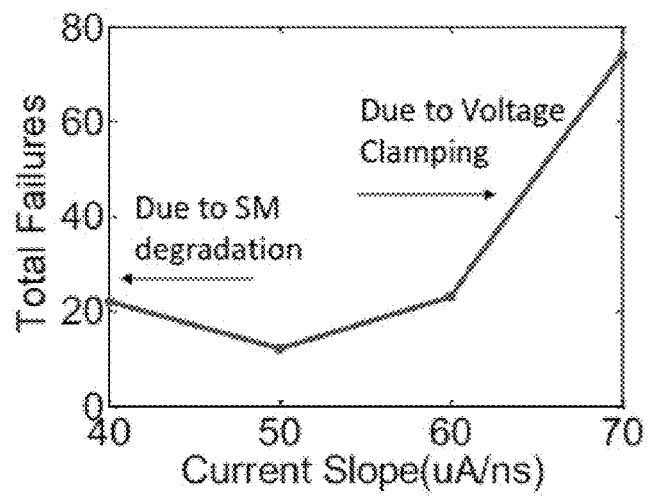
FIG. 14 shows a plot of SM failures.

FIG. 14 shows a plot of total failures with optimum delay and frequency with respect to current slopes (25 mV senseamp offset is considered). A slope of 50 μA/ns provided the minimum number of failures. Decreasing current slope can result in lower ramp voltage, which in turn decreases SM. Failures increased for current slope lower than 50 μA/ns due to SM degradation. The failures also increased for higher current slopes. This may be due to clamping of voltage across MTJ (see also, e.g., FIG. 8). The voltage across the bitcell cannot increase beyond a certain voltage with high current slope, which in turn reduces voltage slope and sense margin.

Figure 15A:
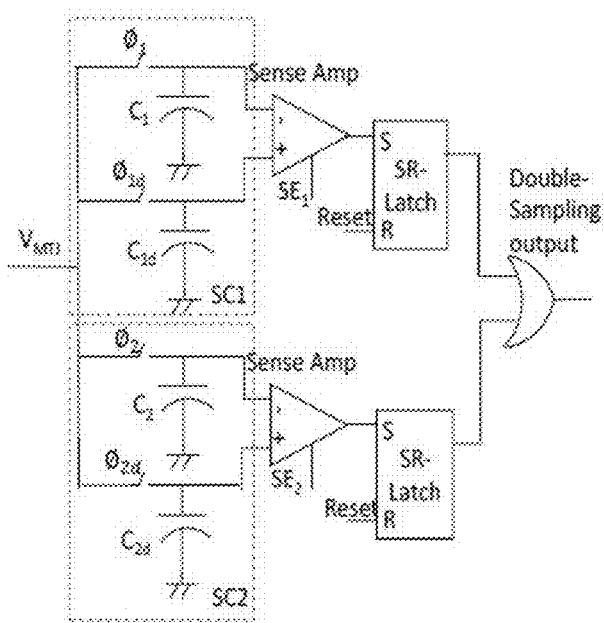
FIG. 15(a) shows a circuit diagram for a sensing scheme according to an embodiment of the subject invention.
Figure 15B:
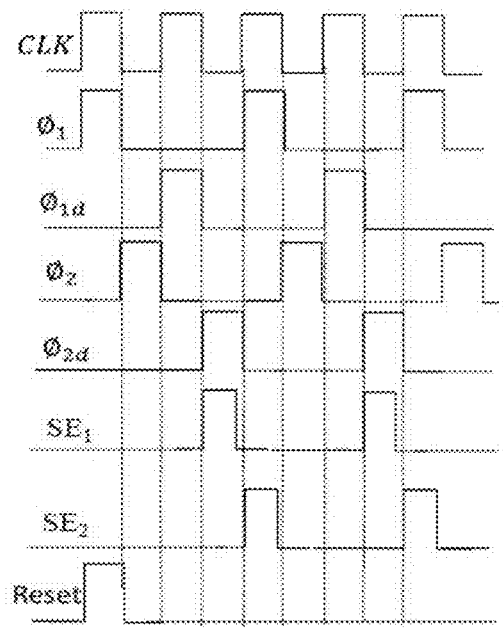
FIG. 15(b) shows a timing diagram for a sensing scheme according to an embodiment of the subject invention.

Sampling with a higher frequency can lead to negative slope detection and inhibit or eliminate the need for optimizing sampling delay to reduce SM1 failures. However, sense margin degradation due to higher sampling frequency can result in an increase in the number of failures. This can be solved by lowering sampling frequency and using two sample and holds with $\phi_2$-$\phi_{2d}$ and $\phi_1$-$\phi_{1d}$ clock phases (where $\phi_2$ and $\phi_{2d}$ are delayed versions of $\phi_1$ and $\phi_{1d}$, respectively) to sample the voltage across the bitcell. FIG. 15(a) shows a circuit diagram of double sampling with lower frequency, and FIG. 15(b) shows a clocks timing diagram. Referring to FIGS. 15(a) and 15(b), in an embodiment, two sense circuits (SC) can be used in order to sense one bitcell. As shown in FIG. 10, a senseamp can be activated after $\phi_{2d}$ (black squares) and $\phi_{1d}$ (black circles). Therefore, the sense margin can be the difference between black and previous white circle voltages, which can be sensed by a first senseamp, or black and previous white square voltages, which can be sensed by a second senseamp. Sampling with frequency $f_2$, $\phi_1$-$\phi_{1d}$ clock phases, can lead to a poor SM1 while sampling with frequency $f_2$, $\phi_2$-$\phi_{2d}$ clock phases can provide a large SM1. Double sampling with both $\phi_1$-$\phi_{1d}$ and $\phi_2$-$\phi_{2d}$ clock phases can provide a large SM1 and does not depend on sampling delay, which in turn increases robustness.

Figures 16A, 16B:
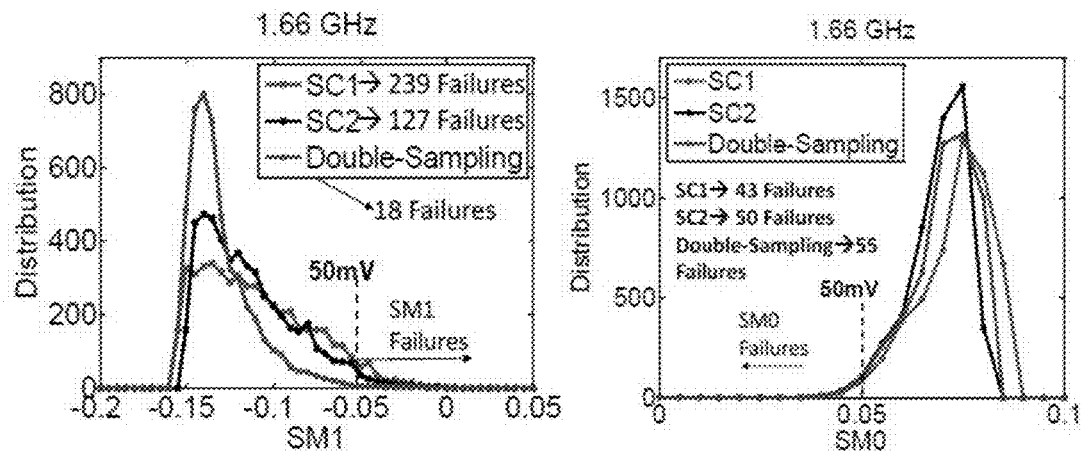
FIG. 16(a) shows a plot of SM distribution.
FIG. 16(b) shows a plot of SM distribution.

Sampling accuracy and robustness can also be improved by increasing the number of sample and holds, though this may come at the cost of more sense amplifiers. In a double sampling method according to an embodiment of the subject invention, if one of the sense amplifiers detects a negative slope (SM1), the output is '1', and otherwise it is '0'. Therefore, the SM1 can be the minimum SM1, which is provided by two sense circuits. As shown in FIGS. 15(a) and 15(b), the mean value of the SM1 distribution and the number of failures can be reduced by a double sampling method compared to using SC1 or SC2 separately (i.e., 239 for SC1 versus 18 for double sampling). In the double sampling method, if one of the senseamp fails to detect a positive slope (SM0), the output can be set to '1'. Therefore, double sampling can affect SM0 negatively, and the SM0 can be the minimum value provided by the two sense circuits. Double sampling does not affect SM0 significantly while improving SM1. FIG. 16(a) shows SM1 distribution for 1.66 GHz sampling frequency with 0 ns sampling delay for SC1 and 0.3 ns sampling delay for SC2. FIG. 16(b) shows SM0 distribution for 1.66 GHz sampling frequency with 0 ns sampling delay for SC1 and 0.3 ns sampling delay for SC2. Referring to FIGS. 16(a) and 16(b), double sampling can reduce SM1 failures and increase SM0, though the SM0 failures are not increased significantly. As shown in FIG. 16(b), SM0 failures increased from 50 to 55, which is a negligible change.

Figure 17:
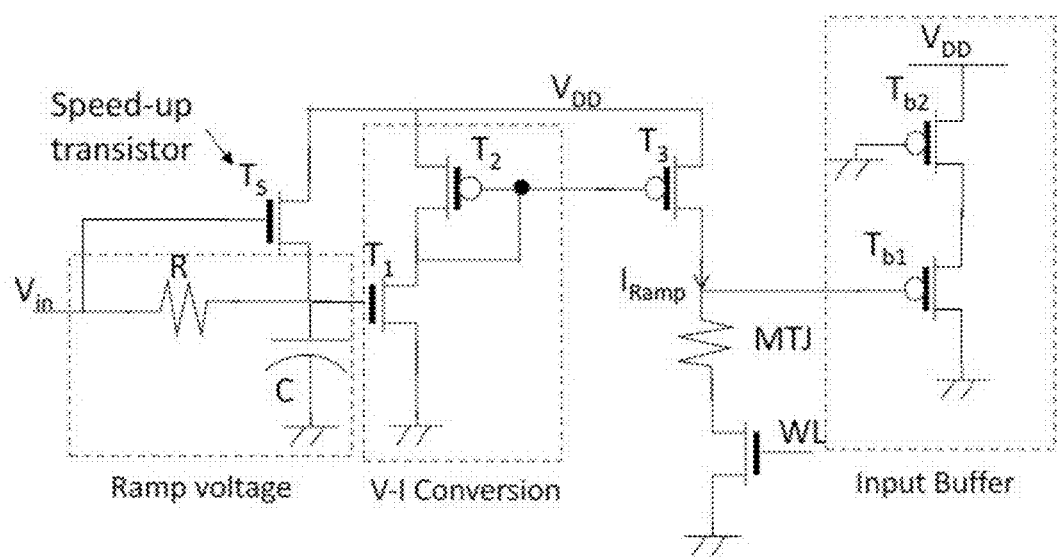
FIG. 17 shows a diagram of a ramp current source and input buffer circuit according to an embodiment of the subject invention.

FIG. 17 shows a diagram of a ramp current source and input buffer circuits according to an embodiment of the subject invention. The circuit can include 22-nm predictive technology [10] (which is hereby incorporated by reference herein in its entirety), though embodiments are not limited thereto. Referring to FIG. 17, ramp current can be generated by a simple ramp voltage (RC low pass filter) which can be connected to the gate of $T_1$. A ramp current can be generated because current flowing from drain to source depends on $V_{GS}$, which can be a ramp voltage. The ramp voltage slope can be determined by resistor and capacitor values. $T_1$ is ON when $V_{GS} > V_{TH}$. Thus, ramp current can be generated after a delay (e.g., when the capacitor is charged to $V_{TH}$). This delay can be on the order of a nanosecond and can increase the sense time. In certain embodiments, a speed up transistor ($T_s$) can be employed to eliminate this delay. When $V_{in}$ goes high, $T_s$ can be turned ON and can charge the capacitor to $V_{TH}$ from a low impedance (from $V_{DD}$) path rapidly. Transistor $T_s$ can be turned OFF when $V_{GS} < V_{TH}$, and the capacitor can be charged from a resistor path, thereby generating a ramp voltage. Next, the ramp current can be mirrored by a PMOS current mirror and can be injected into bitcell (e.g., an STTRAM bitcell). In some embodiments, the ramp current source can be shared in a subarray.

In order to prevent S/H resistance affecting the voltage that is generated by the bitcell, in an embodiment, an input buffer (e.g., an input buffer with a very high input resistance) can be used. For high speed applications, the input buffer can be implemented by a simple source follower whose input transistor has its source connected to the substrate to cancel the body effect [15] (which is hereby incorporated by reference herein in its entirety). Referring again to FIG. 17, the input buffer can include two PMOS transistors. $T_{b1}$ can be a simple current source, and the $T_{b1}$ W/L ratio can be sized to generate sufficient current. Voltage across the bitcell (buffer input voltage) can be started at 0 V (though embodiments are not limited thereto) and increased to $V_{DD}$. If the $T_{b1}$ and $T_{b2}$ are sized equally, the buffer output voltage can be biased around $V_{DD}/2$ and can increase from $V_{DD}/2$ to $V_{DD}$. In order to increase the output voltage swing and decrease voltage slope reduction due to using an input buffer, $T_{b1}$ should be stronger than $T_{b2}$ to reduce the bias point from $V_{DD}/2$ to $V_{TH}$ of $T_{b1}$. This goal can be achieved by choosing the width of $T_{b1}$ to be larger than $T_{b2}$. Therefore, in an embodiment, the buffer offset can be approximately the threshold voltage of $T_{b1}$. In order to reduce this offset voltage, a transistor with a low threshold voltage can be used to provide enough headroom for output.

Figure 18:
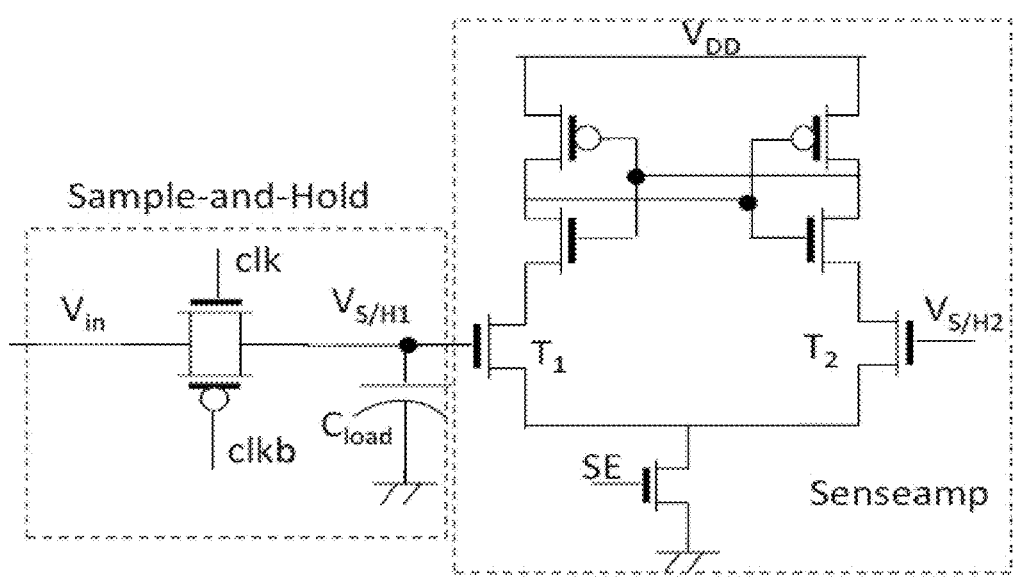
FIG. 18 shows a diagram of sample-and-hold and sense amplifier circuits according to an embodiment of the subject invention.

FIG. 18 shows a diagram of sample-and-hold (S/H) and sense amplifier circuits. Referring to FIG. 18, in an embodiment, an S/H circuit can include a transmission gate and a capacitor. Because the input voltage can change from zero to $V_{DD}$, the transmission gate can be used to provide a rail-to-rail input and output range. Additionally, the transmission gate can provide an ON resistance, which can be the parallel combination of two transistors. Because one resistance increases and the other one decreases proportionally with respect to $V_{DS}$, the total resistance can be kept constant over a wide range of input. Further, using a transmission gate can reduce the charge injection and clock feedthrough effect. The charge injection of the NMOS transistor can be reduced by compensating the injected charge with the equal and opposite charge of a PMOS transistor.

In a double sampling method according to an embodiment of the subject invention, two sample-and-hold circuits can be used for detection (e.g., detection of a negative slope). To implement this technique, the output should remain unchanged after detecting a negative slope (when output is '1'). In a particular embodiment, this can be achieved by using two SR-latches. Initially, the SR-latches can be reset to '0' when the reset signal goes high. When both S and R are '0', the latches can hold their initial values. When a negative slope is detected, S becomes '1' and the latch is set to '1'. Two latch outputs can be ORed; thus, if one of the senseamps detects a negative slope, the output is '1'.

Embodiments of the subject invention provide advantageous slope detection systems and methods that exploit MTJ resistance switching from a high- to a low-resistance state (or vice versa). A low-overhead, sample-and-hold circuit can be used. Slope detection techniques of the subject invention can reduce or eliminate bit-to-bit process variation, thereby reducing or eliminating variation in oxide thickness. In addition, the need for data and reference current can be obviated compared to related art self-reference sensing techniques, and sensing robustness can therefore be increased compared to related art techniques. Multiple sampling, such as double sampling, can be used to increase the robustness even further, though a potential cost for multiple sampling can be extra area overhead compared to single sampling or possibly to self-reference sensing. Simulation results, which will be discussed in the Examples, reveal <0.12% failure under process variation using single sampling (at 0.2% area overhead) and <0.08% failures with double sampling (at 0.6% area overhead). The overall sense time can be 10 nanoseconds (ns) or less (for example, 7 ns).

The systems, methods, and processes described herein can be embodied as code and/or data. The software code and data described herein can be stored on one or more computer-readable media, which may include any device or medium that can store code and/or data for use by a computer system. When a computer system reads and executes the code and/or data stored on a computer-readable medium, the computer system performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that is capable of storing computer-readable information/data. Computer-readable media should not be construed or interpreted to include any propagating signals.

The subject invention includes, but is not limited to, the following exemplified embodiments.

Embodiment 1. A method for detecting the slope of a current-voltage (I-V) curve of memory, the method comprising:

monitoring, using a main circuit, the resistance of a magnetic tunnel junction (MTJ) of the memory;

if the resistance of the MTJ switches from a low-resistance state to a high-resistance state, determining that the slope of the I-V curve has changed from negative to positive; and if the resistance of the MTJ switches from a high-resistance state to a low-resistance state, determining that the slope of the I-V curve has changed from positive to negative.

Embodiment 2. The method according to embodiment 1, further comprising injecting a ramp current into the MTJ (e.g., before the monitoring step).

Embodiment 3. The method according to any of embodiments 1-2, wherein the main circuit comprises a sample-and-hold circuit, a sense amplifier circuit, or both.

Embodiment 4. The method according to any of embodiments 1-3, wherein the main circuit (further) comprises a ramp current source circuit.

Embodiment 5. The method according to any of embodiments 2-4, wherein the ramp current injected into the MTJ originates from a (the) ramp current source circuit.

Embodiment 6. The method according to any of embodiments 1-5, wherein the main circuit (further) comprises an input buffer circuit.

Embodiment 7. The method according to any of embodiments 3-6, wherein the sample-and-hold circuit comprises a first variable capacitor and a second variable capacitor.

Embodiment 8. The method according to any of embodiments 1-7, wherein the memory is Spin-Torque Transfer Random Access Memory (STTRAM) or Magnetic Random Access Memory (MRAM).

Embodiment 9. The method according to any of embodiments 1-8, wherein monitoring the resistance of the MTJ comprises double sampling using the main circuit.

Embodiment 10. The method according to any of embodiments 1-8, wherein monitoring the resistance of the MTJ comprises triple sampling using the main circuit.

Embodiment 11. The method according to any of embodiments 3-6 or 8, wherein monitoring the resistance of the MTJ comprises double sampling using the main circuit, wherein the sample-and-hold circuit comprises a first variable capacitor and a second variable capacitor, wherein a voltage of the MTJ at a first sampling time is stored in the first variable capacitor, and wherein a voltage of the MTJ at a second sampling time different from the first sampling time is stored in the second variable capacitor.

Embodiment 12. A method for detecting the state of a current of memory, the method comprising:

monitoring, using a main circuit, the resistance of an MTJ of the memory;

if the resistance of the MTJ switches from a low-resistance state to a high-resistance state, determining that the current is negative; and if the resistance of the MTJ switches from a high-resistance state to a low-resistance state, determining that the current is positive.

Embodiment 13. The method according to embodiment 12, wherein the main circuit comprises a sample-and-hold circuit, a sense amplifier circuit, or both.

Embodiment 14. The method according to any of embodiments 12-13, wherein the main circuit (further) comprises a ramp current source circuit.

Embodiment 15. The method according to any of embodiments 12-14, wherein the main circuit (further) comprises an input buffer circuit.

Embodiment 16. The method according to any of embodiments 13-15, wherein the sample-and-hold circuit comprises a first variable capacitor and a second variable capacitor.

Embodiment 17. The method according to any of embodiments 12-16, wherein the memory is STTRAM or MRAM.

Embodiment 18. The method according to any of embodiments 12-17, wherein monitoring the resistance of the MTJ comprises double sampling using the main circuit.

Embodiment 19. The method according to any of embodiments 12-17, wherein monitoring the resistance of the MTJ comprises triple sampling using the main circuit.

Embodiment 20. The method according to any of embodiments 12-19, wherein, if the resistance of the MTJ switches from a low-resistance state to a high-resistance state, the method comprises determining that the current is negative and greater than a critical current in magnitude; and if the resistance of the MTJ switches from a high-resistance state to a low-resistance state, the method comprises determining that the current is positive and greater than the critical current in magnitude.

Embodiment 21. A system for detecting the slope of an I-V curve of memory, the system comprising a main circuit configured to:

inject a ramp current into an MTJ of the memory;

monitor the resistance of an MTJ of the memory;

if the resistance of the MTJ switches from a low-resistance state to a high-resistance state, determining that the slope of the I-V curve has changed from negative to positive; and if the resistance of the MTJ switches from a high-resistance state to a low-resistance state, determining that the slope of the I-V curve has changed from positive to negative.

Embodiment 22. The system according to embodiment 21, wherein the main circuit comprises a sample-and-hold circuit, a sense amplifier circuit, or both.

Embodiment 23. The system according to any of embodiments 21-22, wherein the main circuit (further) comprises a ramp current source circuit, an input buffer circuit, or both.

Embodiment 24. The system according to any of embodiments 21-22, wherein the main circuit (further) comprises a ramp current source circuit, and wherein the ramp current injected into the MTJ originates from the ramp current source circuit.

Embodiment 25. The system according to any of embodiments 21-24, wherein the memory is STTRAM or MRAM.

Embodiment 26. The system according to any of embodiments 21 or 23-25, wherein the main circuit comprises a sample-and-hold circuit, and wherein the sample-and-hold circuit comprises a first variable capacitor and a second variable capacitor.

Embodiment 27. The system according to any of embodiments 21 or 23-25, wherein monitoring the resistance of the MTJ comprises double sampling using the main circuit,
wherein the main circuit comprises a sample-and-hold circuit,
wherein the sample-and-hold circuit comprises a first variable capacitor and a second variable capacitor,
wherein a voltage of the MTJ at a first sampling time is stored in the first variable capacitor, and
wherein a voltage of the MTJ at a second sampling time different from the first sampling time is stored in the second variable capacitor.

Embodiment 28. A system for detecting the state of a current of memory, the system comprising a main circuit configured to:
monitor the resistance of an MTJ of the memory;
if the resistance of the MTJ switches from a low-resistance state to a high-resistance state, determine that the current is negative; and
if the resistance of the MTJ switches from a high-resistance state to a low-resistance state, determine that the current is positive.

Embodiment 29. The system according to embodiment 28, wherein the main circuit comprises a sample-and-hold circuit, a sense amplifier circuit, or both.

Embodiment 30. The system according to any of embodiments 28-29, wherein the main circuit (further) comprises a ramp current source circuit, an input buffer circuit, or both.

Embodiment 31. The system according to any of embodiments 28-30, wherein the memory is STTRAM or MRAM.

Embodiment 32. The system according to any of embodiments 28 or 30-31, wherein the main circuit comprises a sample-and-hold circuit, and wherein the sample-and-hold circuit comprises a first variable capacitor and a second variable capacitor.

Embodiment 33. The system according to any of embodiments 28-32, wherein, if the resistance of the MTJ switches from a low-resistance state to a high-resistance state, the method comprises determining that the current is negative and greater than a critical current in magnitude; and
if the resistance of the MTJ switches from a high-resistance state to a low-resistance state, the method comprises determining that the current is positive and greater than the critical current in magnitude.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

EXAMPLE 1

Figure 3A:
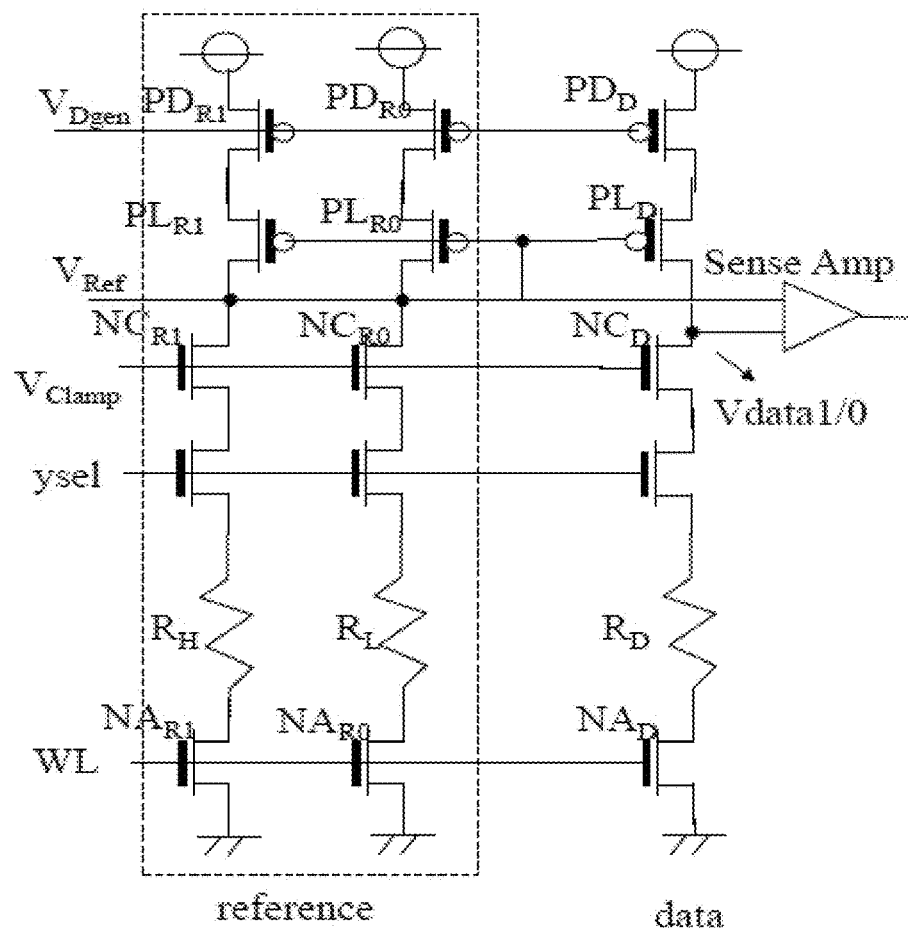
FIG. 3(a) shows a schematic of a non-destructive sensing scheme.

In a non-destructive voltage sensing scheme, a sense circuit can be used to identify the resistance of the data MTJ. In order to make the comparison, data MTJ resistance can be compared against a reference MTJ resistance (e.g., an average of fixed high- and low-MTJ resistances). FIG. 3(a) shows a plot of voltage sensing where a reference current is injected in both a data leg and reference legs and the resulting voltage is compared by a voltage sense amplifier. Poor sense margin (SM) can result in incorrect interpretation of the MTJ state. For example, if the offset voltage of the sense amplifier is +/−25 millivolts (mV), a sense margin of 25 mV can be read as either '0' or '1'.

Figure 3B:
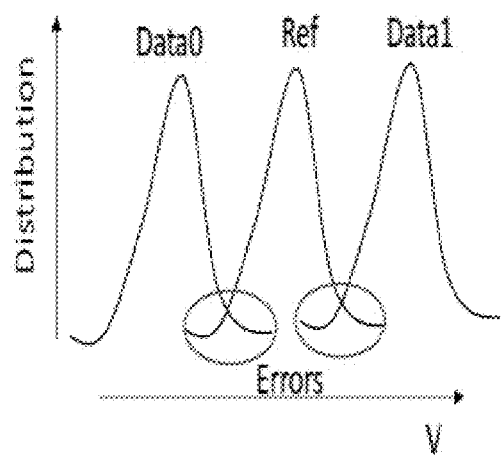
FIG. 3(b) shows a plot of distributions.

An MTJ model, such as the one disclosed in [9] (which is hereby incorporated by reference herein in its entirety), can be used to perform process variation analysis. Process variations for read operation can be modeled by incorporating variations in MTJ as well as an access transistor. Tunnel oxide barrier and surface area variations can be assumed for the MTJ. Variations in the access transistor can be lumped in threshold voltage fluctuation. The mean and standard deviation of these parameters are shown in Table 1. In non-destructive sensing, resistance of data MTJ can be compared against the resistance of a reference MTJ to determine the bitcell content. Therefore, reference resistance and data resistance variation can result in incorrect interpretation of bitcell content. Referring to FIG. 3(b), a plot of Data0, Data1, and reference voltage distribution is shown. Sensing error can occurs where the reference voltage overlaps with the Data0/1 voltage.

Critical transistors in STTRAM sense circuit can include the PMOS load (PL) and NMOS clamp (NC) (see, e.g., FIG. 3(a)). The clamp voltage and clamp transistor size can set the current in the leg. The load transistor can set the output voltage where the NMOS and PMOS drain currents intersect. Mismatch between matched-pair transistors in the sense circuit can degrade the SM. Because the size of the PL is smaller than the NC transistor, the SM can be most sensitive to mismatch between the PL transistors of the reference legs ($PL_R$) with that of the data leg ($PL_D$). One sigma of VT variation is given by Equation (1):

$$\sigma_{V_T} = \frac{A_{V_T}}{\sqrt{W \cdot L}}, \qquad (1)$$

where W and L are the width and length, respectively, of the transistor, and $A_{V_T}$ is a pelgrom coefficient [14] (which is hereby incorporated by reference herein in its entirety).

Figures 3C, 3D:
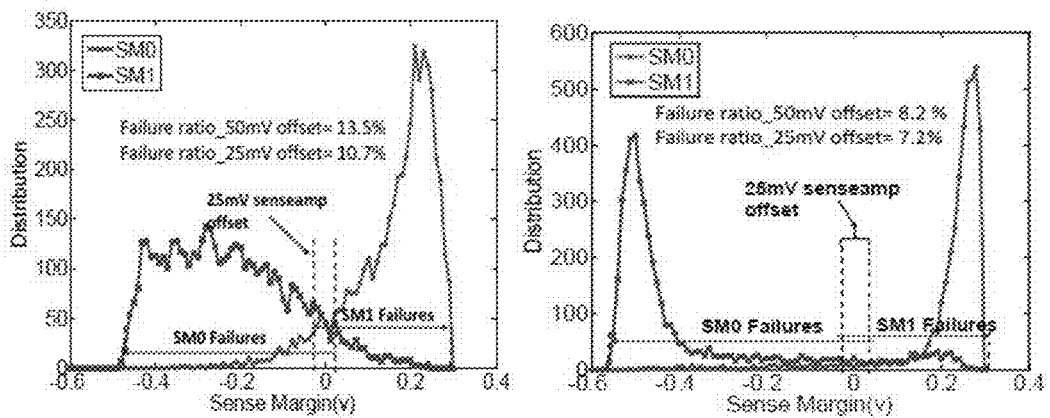
FIG. 3(c) shows a plot of distributions.
FIG. 3(d) shows a plot of distributions.

A sense circuit can be designed to reduce the impact of process variation on SM. This can be achieved by increasing the width and length of PL transistors to reduce the VT mismatch between $PL_D$ and $PL_R$, and optimizing other design parameters (e.g., NC width, $V_{clamp}$, and $V_{Ref}$) to maximize both SM0 and SM1. Because NC and PL transistors in the data leg can be shared in a global column (a global column consisting of 8 local columns) and the reference legs can be shared among 32 columns, their sigma can be $1/\sqrt{8}$ and $1/\sqrt{32}$, respectively, of sigma calculated by Equation (1). FIG. 3(c) shows a plot of distributions of SM0 and SM1 for 10000 monte-carlo points.

A simulation revealed that 10% of bitcells fail sensing due to SM0 failures and 11.2% fail due to SM1 failures, which result in 10.7% total failures for 25 mV senseamp offset. It is evident that non-destructive conventional sensing is prone to process variation. To reduce the large sense margin variation, the source degeneration scheme can be used with longer channel length for PMOS load transistor [11] (which is hereby incorporated by reference herein in its entirety). A source degeneration PMOS (PD) can be added to the source of PL transistors to reduce current variation and increase effective resistance, which can result in SM improvement. FIG. 3(d) shows a plot of SM0 and SM1 distributions for 10000 monte-carlo points with a source degeneration scheme. The simulation revealed 4.7% SM0 failures and 11% SM1 failures, which result in 7.2% total failures for 25 mV senseamp offset. When bitcell resistance is high, data current is low. Thus, a small variation due to resistance variation and transistor mismatch can result in large variation in data leg current, leading to more SM1 failures compared to SM0 failures. Although source degeneration reduces SM0 failures, SM1 failures are still significant, which underscores the need for a self-reference scheme to inhibit or eliminate bit-to-bit variation and the mismatch between matched-pair transistors in data and reference legs.

TABLE 1

Parameters used for process variation study.

| Device | Parameter | Mean | Std. Dev. |
|---|---|---|---|
| PMOS | $V_{TH}$ | 0.46 | 50 mV |
| NMOS | $V_{TH}$ | 0.5 | 50 mV |
| MTJ | MgO Thickness | 1.1 nm | 5% |
|  | Shape Area | $Pi*25e^{-9}$ | 15% |

EXAMPLE 2

Figure 4:
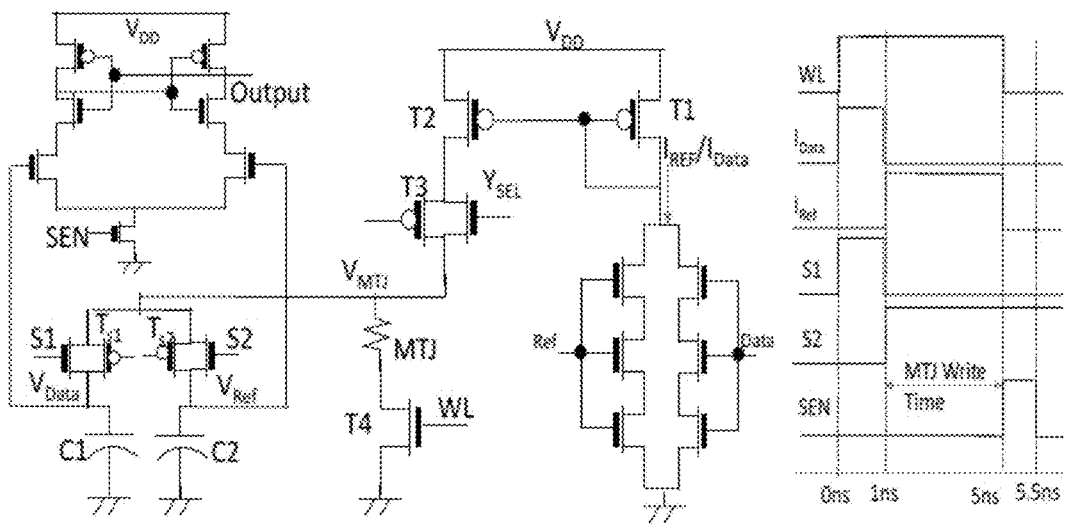
FIG. 4 shows a circuit diagram and a timing diagram for a self-reference sensing scheme.

In self-reference sensing, voltage generated by the data current across the MTJ can be compared to the voltage generated by a reference current across the same MTJ. Therefore, the bit-to-bit variation in MTJ resistance can be inhibited or eliminated. FIG. 4 shows a self-reference sensing scheme (left side) and a sense circuit timing diagram (right side). Referring to FIG. 4, a self-reference sensing scheme can start with a read current $I_{Data}$ being injected into a bitcell and the resulting voltage being stored in a capacitor C1. The voltage can be $V_{DataH}$ or $V_{DataL}$ if the MTJ resistance is high or low, respectively. A zero can then be written into the MTJ. Next, another read current $I_{Ref}$ can be applied to generate voltage $V_{Ref}$, which can be stored in, for example, capacitor C2. Then, $V_{Data}$ and $V_{Ref}$ can be compared to determine the bitcell content, and the read data can be written back to the MTJ.

Figure 5:
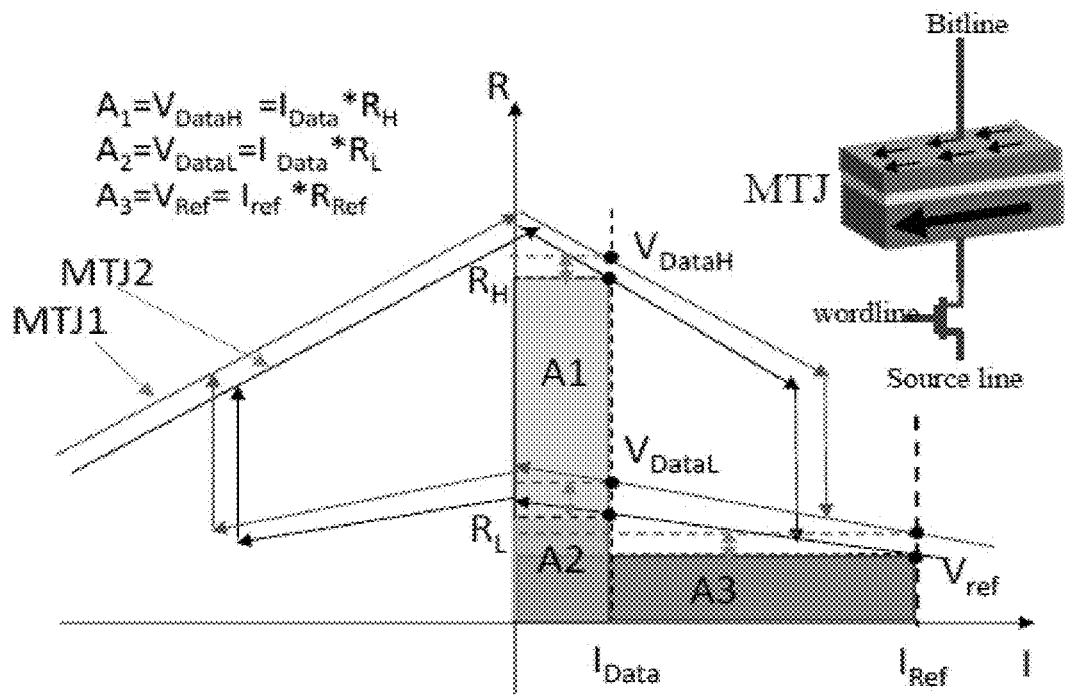
FIG. 5 shows current-resistance characteristics of two MTJs.

Process-variation considerations are important in determining appropriate values of $I_{Ref}$ and $I_{Data}$. FIG. 5 shows current-resistance (I-R) curves of two MTJs under process variation. If a current is injected from the bitline to the source line, the MTJ can switch from a high- to a low-resistance state. In contrast, if a current is injected from the source line to the bitline, the MTJ can switch from a low- to high-resistance state. The $I_{Data}$ and $I_{Ref}$ should be chosen such that SM0 is positive and SM1 is negative. Therefore, the area A3 (which is essentially voltage) should be greater than A2 and less than A1, resulting in following inequalities:

$$V_{DataL} < V_{Ref} < V_{DataH}$$

$$SM0 = V_{Ref} - V_{DataL} > 0$$

$$SM1 = V_{Ref} - V_{DataH} < 0 \qquad (2)$$

Determining optimum $I_{Ref}$ and $I_{Data}$ to achieve the best sense margin for each bitcell under process variation can be difficult or even impossible from an implementation standpoint. Choosing $I_{Ref}$ and $I_{Data}$ to maximize the SM for a majority of the bitcells can be challenging as well. FIG. 5 shows the voltage fluctuation in two MTJs due to process variation. The areas labeled A1, A2, and A3 which are $V_{DataH}$, $V_{Ref}$ and $V_{DataL}$, respectively, can fluctuate due to process variation. Therefore, determining corresponding data and reference currents to maximize sense margin for all bitcells can be beneficial though challenging.

Figure 6A:
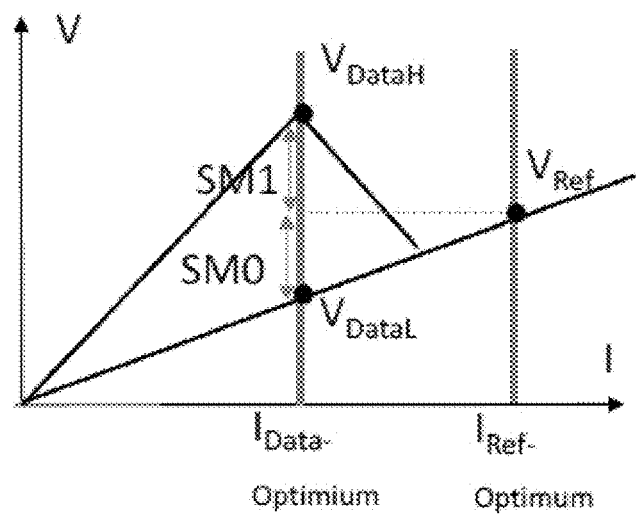
FIG. 6(a) shows current-voltage curves of an MTJ with high- and low-resistance states initially.
Figure 6B:
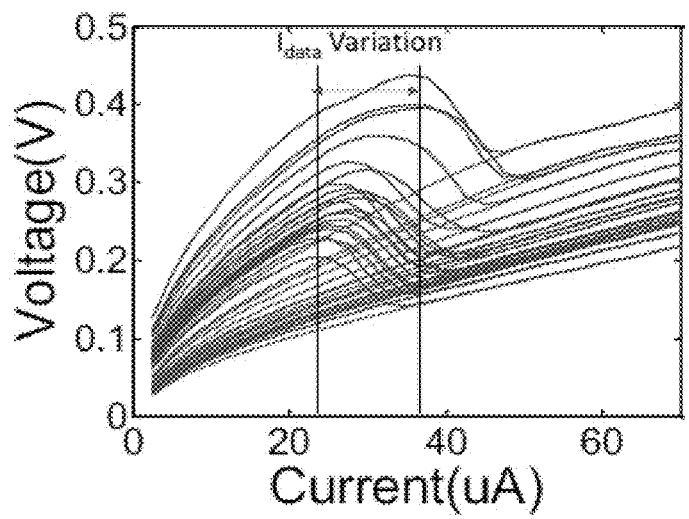
FIG. 6(b) shows plots of optimum data current variation.

To demonstrate the impact of process variation on data and reference current requirements the bitcell current from the bitline to the source line was swept. If the bitcell state is low, the voltage across MTJ increases monotonically with current. However, if the bitcell state is high, it switches to a low-resistance state beyond the critical current. Therefore, the voltage can change from high to low. FIG. 6(a) shows I-V curves of an MTJ with high- and low-resistance states initially, and FIG. 6(b) shows optimum data current variation. Referring to FIGS. 6(a) and 6(b), $I_{Ref}$ and $I_{Data}$ should be chosen carefully to ensure positive SM for high data and negative SM for low data. Therefore, $V_{Ref}$ should be greater than $V_{DataL}$ and less than $V_{DataH}$ where $V_{DataL}$ and $V_{DataH}$ are the voltages across the MTJ when the stored data is low and high, respectively. As shown in FIG. 6(a), the optimum $I_{Data}$ is the current that maximizes SM0+SM1 (i.e., the current where $V_{DataH}$ is maximum). Optimum $I_{Ref}$ can be chosen such that SM0 and SM1 are equalized or approximately equalized. FIG. 6(b) shows the optimum $I_{Data}$ variation, which can result in optimum $I_{Ref}$ variation. Two cases were evaluated to determine robust reference and data current: Case A (optimum), in which data and reference currents were bit-to-bit optimal to maximize the sense margins; and Case B ($I_{Data}$-Mean, $I_{Ref}$-mean), in which both data and reference current were the mean value of the current distribution.

Figure 7:
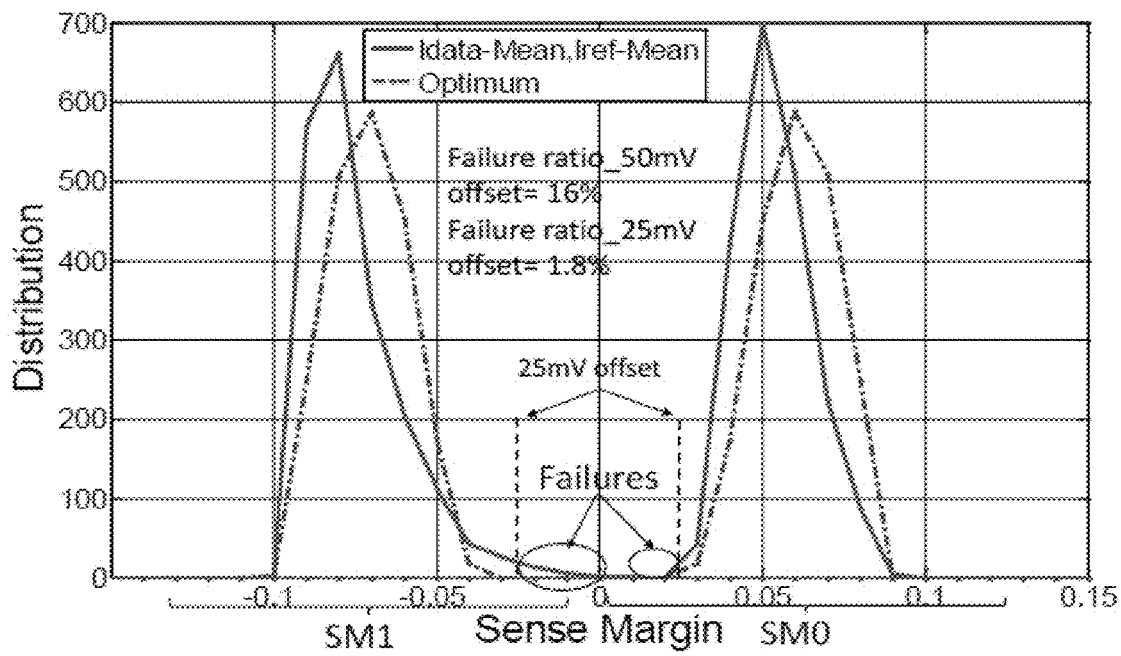
FIG. 7 shows a plot of sense margin distribution.

FIG. 7 shows the SM distribution for 5000 Monte-Carlo points for Cases A and B. Case A provides a distribution with a lower standard deviation and higher mean value, which results in good SMs for all bitcells and provides a minimum (or, at least, low) number of failures. However, the number of failures increased significantly (failure ratio of 1.8%) in Case B. In addition, the ratio of SM failures increased significantly (16%) for Case B for 50 mV senseamp offset. Even by providing optimum data and reference current for each bitcell, the failure ratio was 9.5% for 50 mV senseamp offset. Hence, there is a need for a sensing scheme that eliminates data and reference current. Examples 1 and 2 demonstrate the disadvantages that can be overcome with systems and methods of the subject invention.

EXAMPLE 3

The sample and hold behavior shown in FIG. 10 was simulated. FIG. 11(a) shows SM failures (50 mV senseamp offset was considered) with respect to sampling delay for a frequency of 2 GHz, and FIG. 11(b) shows SM failures (50 mV senseamp offset was considered) with respect to sampling delay for a frequency of 1.66 GHz. FIG. 12(a) shows the SM1 distribution for 5000 monte-carlo points for different sampling frequency with optimum sampling delay, and FIG. 12(c) shows the SM0 distribution for 5000 monte-carlo points for different sampling frequency with optimum sampling delay. FIG. 12(b) shows SM1 failures with respect to sampling frequency (50 mV senseamp offset is considered), and FIG. 12(d) shows SM0 failures with respect to sampling frequency (same offset).

Referring to FIG. 12(b), sampling with 2 GHz (optimum frequency) resulted in a minimum number of failures (37 out of 5000). Increasing the sampling frequency resulted in more sensing failures due to sense margin degradation, and decreasing the sampling frequency resulted in more sensing failures due to incorrect slope detection.

Referring to FIG. 12(c), reducing sampling frequency increased the mean value of SM0 distribution, which in turn reduced SM0 failures. Positive slope (SM0) was detected several times during sense operation; thus, SM0 was at a minimum during sensing. By increasing sampling frequency SM1 failures were minimized at a particular frequency (2 GHz) while SM0 failures were increased.

FIG. 13(a) shows a plot of total sensing failures for 10000 monte-carlo points for 50 mV senseamp offset for a ramp current slope of 50 μA/ns, and FIG. 13(b) shows a plot of total sensing failures for 10000 monte-carlo points for 25 mV senseamp offset for a ramp current slope of 50 μA/ns. Referring to FIGS. 13(a) and 13(b), simulations indicate that total failures were minimized at a sampling frequency of 1.66 GHz or about 1.66 GHz.

FIG. 14 shows a plot of total failures with optimum delay and frequency with respect to current slopes (25 mV senseamp offset was considered). A slope of 50 μA/ns provided the minimum number of failures. Decreasing current slope resulted in lower ramp voltage, which in turn decreased SM. Failures increased for current slope lower than 50 μA/ns due to SM degradation. The failures also increased for higher current slopes.

EXAMPLE 4

Double sampling was performed using two sample and holds with $\phi_2$-$\phi_{2d}$ and $\phi_1$-$\phi_{1d}$ clock phases (where $\phi_{2d}$ and $\phi_{2d}$ are delayed versions of $\phi_1$ and $\phi_{1d}$, respectively) to sample the voltage across a bitcell. The circuit diagram of FIG. 15(a) and the timing diagram of FIG. 15(b) were used. Referring to FIGS. 15(a) and 15(b), the mean value of the SM1 distribution and the number of failures can be reduced by a double sampling method compared to using SC1 or SC2 separately (239 for SC1 versus 18 for double sampling). FIG. 16(a) shows SM1 distribution for 1.66 GHz sampling frequency with 0 ns sampling delay for SC1 and 0.3 ns sampling delay for SC2. FIG. 16(b) shows SM0 distribution for 1.66 GHz sampling frequency with 0 ns sampling delay for SC1 and 0.3 ns sampling delay for SC2. Referring to FIGS. 16(a) and 16(b), double sampling reduced SM1 failures and increased SM0, though the SM0 failures were not increased significantly. As shown in FIG. 16(b), SM0 failures increased from 50 to 55, which was a negligible change.

EXAMPLE 5

Existing sensing techniques were compared with sensing systems and methods of the subject invention. The failure ratio (100*failures/number of bitcells), power consumption, area overhead, and sense time was determined for the method of [11], the method of [7] (which is hereby incorporated by reference herein in its entirety), a single senseamp system of the subject invention (e.g., FIG. 9), and a double-sampling system of the subject invention (e.g., FIG. 15). Table 2 shows the results. Referring to Table 2, the slope detection sensing failure ratio was significantly lower for the systems of the subject invention than it was for either the self-reference sensing of [7] or the non-destructive sensing of [11].

Because different currents result in different write times (MTJ flipping time), the same average current was used to compare sense times of slope sensing and self-reference sensing techniques. In the simulation all MTJs flipped before 3.3 ns for current slope of 50 μA/ns (optimum current slope); thus the MTJ write time was 3.3 ns. The slope detection sensing of the subject invention was performed in two steps: 1) sampling voltage across MTJ while detecting voltage slope; and 2) the original data was written back to the MTJ. The Self-reference technique of [7] required five steps to sense one bitcell (timing diagram is shown in FIG. 4). Therefore, elimination of these steps make slope detection techniques of the subject invention faster.

The sense circuit areas reported in Table 2 were calculated for only one bitcell sensing. The proposed double sampling technique has more area overhead compared to self-reference and nondestructive sensing due to using two senseamps and two sense circuits. However, because the sense circuit and senseamp are shared among all bitcells in a global column, area overhead for double sampling method is acceptable in a large STTRAM array where robustness is more important than speed and area overhead. For example, in a subarray of 256K bits with 512 word-lines and 512 local columns, single sampling incurs 0.2% area overhead compared to self-reference sensing and double sampling incurs 0.6% area overhead compared to self-reference sensing and 0.4% area overhead compared to single sampling. Additionally, though slope detection consumes more power compared to nondestructive sensing, it consumes less power compared to self-reference sensing due to the elimination of $I_{Data}$ and $I_{Ref}$.

TABLE 2

Comparison of sensing schemes.

| Sense Scheme | Area | Power | Sense time | Failure ratio (25 mV offset) | Failure ratio (50 mV offset) |
| --- | --- | --- | --- | --- | --- |
| Slope detection single senseamp | 1.5 um$^2$ | 150 uW | 7 ns | 0.12% | 1.11% |
| Slope detection double-sampling | 2.6 um$^2$ | 180 uW | 7 ns | 0.08% | 0.73% |
| Non-destructive (source-degeneration)[11] | 1.03 um$^2$ | 80 uW | 2.5 ns | 7.2% | 8.2% |
| Self-Reference [7] | 1.2 um$^2$ | 190 uW | 9.5 ns | 1.8% | 16% |

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] M. Hosomi, et al. "A novel nonvolatile memory with spin torque transfer magnetization switching: Spin-RAM." IEDM, 2005.

[2] J-H. Song, et al. "Sensing margin trend with technology scaling in MRAM." Intl. Jour. of Circuit Theory and Appl., 2011.

[3] Sun, Zhenyu, et al. "Voltage driven nondestructive self-reference sensing scheme of spin-transfer torque memory." Very Large Scale Integration (VLSI) Systems, IEEE Transactions on 20.11 (2012): 2020-2030.

[4] D. Halupka, et al. "Negative-resistance read and write schemes for STTMRAM in 0.13 μm CMOS." ISSCC, 2010.

[5] F. Ren, et al. "A body-voltage-sensing-based short pulse reading circuit for spin-torque transfer RAMs (STT-RAMs)." ISQED, 2012.

[6] Y. Emre, et al. "Enhancing the reliability of STT-RAM through circuit and system level techniques." SiPS, 2012.

[7] G. Jeong, et al. "A 0.24-m 2.0-V 1T1MTJ 16-kb nonvolatile magnetoresistance RAM with self-reference sensing scheme," IEEE J. Solid-State Circuits, 2003.
[8] Chen, Yiran, et al. "A 130 nm 1.2 V/3.3 V 16 Kb spin-transfer torque random access memory with nondestructive self-reference sensing scheme." Solid-State Circuits, IEEE Journal of 47.2 (2012): 560-573.
[9] https://nanohub.org/resources/19048.
[10] Predictive technology model, ASU, http://www.asu.edu/~ptm.
[11] Jung, Seong-Ook, et al. "Balancing a signal margin of a resistance based memory circuit." U.S. Pat. No. 7,889,585. 15 Feb. 2011.
[12] Kim, Jisu, et al. "STT-MRAM Sensing Circuit With Self-Body Biasing in Deep Submicron Technologies." Very Large Scale Integration (VLSI) Systems, IEEE Transactions on 22.7 (2014): 1630-1634.
[13] Au, Edward KS, et al. "A novel current-mode sensing scheme for magnetic tunnel junction MRAM." *Magnetics, IEEE Transactions on* 40.2 (2004):483-488.
[14] Pelgrom, Marcel J M, Aad C J Duinmaijer, and Anton P G Welbers. "Matching properties of MOS transistors." *IEEE Journal of solid-state circuits* 24.5 (1989): 1433-1439.
[15] Hadidi, Khayrollah, et al. "A novel highly linear CMOS buffer." *Electronics, Circuits and Systems,* 1998 *IEEE International Conference on*. Vol. 3. IEEE, 1998.
[16] Yiran Chen "A nondestructive self-reference scheme for Spin-Transfer Torque Random Access Memory (STT-RAM)" *Design, Automation & Test in Europe Conference & Exhibition,* 2010.
[17] Durlam M, Naji P. "Nonvolatile RAM based on Magnetic Tunnel Junction Elements." *Solid-State Circuits Conference, Digest of Technical Papers, ISSCC, IEEE International,* 2000.
[18] U.S. Pat. No. 8,547,738
[19] U.S. Pat. No. 8,576,631
[20] U.S. Pat. No. 8,665,638
[21] U.S. Patent Application Publication No. 2014/0035662

What is claimed is:

1. A method for detecting the slope of a current-voltage (I-V) curve of memory, the method comprising:
   injecting a ramp current into a magnetic tunnel junction (MTJ) of the memory;
   monitoring, using a main circuit comprising a sample-and-hold circuit and a sense amplifier circuit, the resistance of the MTJ of the memory;
   if the resistance of the MTJ switches from a low-resistance state to a high-resistance state, determining that the slope of the I-V curve has changed from negative to positive; and
   if the resistance of the MTJ switches from a high-resistance state to a low-resistance state, determining that the slope of the I-V curve has changed from positive to negative.,
   wherein monitoring the resistance of the MTJ comprises double sampling using the main circuit.

2. The method according to claim 1, wherein the main circuit further comprises a ramp current source circuit, wherein the ramp current injected into the MTJ originates from the ramp current source circuit.

3. The method according to claim 2, wherein the main circuit further comprises an input buffer circuit.

4. The method according to claim 3, wherein the sample-and-hold circuit comprises a first variable capacitor and a second variable capacitor.

5. The method according to claim 1, wherein the main circuit further comprises an input buffer circuit.

6. The method according to claim 1, wherein the memory is Spin-Torque Transfer Random Access Memory (STTRAM) or Magnetic Random Access Memory (MRAM).

7. The method according to claim 1, wherein monitoring the resistance of the MTJ comprises triple sampling using the main circuit.

8. The method according to claim 1, wherein the sample-and-hold circuit comprises a first variable capacitor and a second variable capacitor.

9. The method according to claim 8, wherein monitoring the resistance of the MTJ comprises double sampling using the main circuit,
   wherein a voltage of the MTJ at a first sampling time is stored in the first variable capacitor, and
   wherein a voltage of the MTJ at a second sampling time different from the first sampling time is stored in the second variable capacitor.

10. A method for detecting the state of a current of memory, the method comprising:
    monitoring, using a main circuit comprising a sample-and-hold circuit and a sense amplifier circuit, the resistance of a magnetic tunnel junction (MTJ) of the memory;
    if the resistance of the MTJ switches from a low-resistance state to a high-resistance state, determining that the current is negative; and
    if the resistance of the MTJ switches from a high-resistance state to a low-resistance state, determining that the current is positive,
    wherein monitoring the resistance of the MET comprises double sampling sing the main circuit.

11. The method according to claim 10, wherein the main circuit further comprises a ramp current source circuit.

12. The method according to claim 11, wherein the main circuit further comprises an input buffer circuit.

13. The method according to claim 10, wherein the main circuit further comprises an input buffer circuit.

14. The method according to claim 10, wherein the memory is Spin-Torque Transfer Random Access Memory (STTRAM) or Magnetic Random Access Memory (MRAM).

15. The method according to claim 10, wherein monitoring the resistance of the MTJ comprises triple sampling using the main circuit.

16. The method according to claim 10, wherein, if the resistance of the MTJ switches from a low-resistance state to a high-resistance state, the method comprises determining that the current is negative and greater than a critical current in magnitude; and
    if the resistance of the MTJ switches from a high-resistance state to a low-resistance state, the method comprises determining that the current is positive and greater than the critical current in magnitude.

17. A system for detecting the slope of a voltage-current (I-V) curve of memory, the system comprising a main circuit configured to:
    inject a ramp current into a magnetic tunnel junction (MTJ) of the memory;
    monitor the resistance of an MTJ of the memory;
    if the resistance of the MTJ switches from a low-resistance state to a high-resistance state, determining that the slope of the I-V curve has changed from negative to positive; and if the resistance of the MTJ switches from a high-resistance state to a low-resistance state, determining that the slope of the I-V curve has changed from positive to negative, wherein the main circuit comprises a sample-and-hold circuit and a sense amplifier circuit, wherein monitoring the resistance of the MTJ comprises double sampling using the main circuit, wherein the sample-and-hold circuit comprises a first variable capacitor and a second variable capacitor.

wherein a voltage of the MTJ sampling time is stored in the first variable capacitor. and wherein a voltage of the MEI at a second sampling time different from the first sampling time is stored in the second variable capacitor.

* * * * *

UNITED STATES PATENT AND TRADEMARK OFFICE
CERTIFICATE OF CORRECTION

PATENT NO. : 9,818,466 B2
APPLICATION NO. : 15/198934
DATED : November 14, 2017
INVENTOR(S) : Swaroop Ghosh and Seyedhamidreza Motaman It is certified that error appears in the above-identified patent and that said Letters Patent is hereby corrected as shown below:

In the Specification

Column 5,
Line 15, "(overdrive voltage of transistor $T_2$)-\$T_{od3}$" should read --(overdrive voltage of transistor $T_2$) -$V_{od3}$--.

In the Claims

Column 18,
Line 34, In Claim 10, "resistance of the MET comprises" should read --resistance of the MTJ comprises--.
Line 35, In Claim 10, "sampling sing the main" should read --sampling using the main--.

Column 19,
Lines 10-11, In Claim 17, "variable capacitor. wherein" should read --variable capacitor, wherein--.
Line 11, In Claim 17, "the MTJ sampling time" should read --the MTJ at a first sampling time--.
Line 12, In Claim 17, "capacitor. and" should read --capacitor, and--.
Line 13, In Claim 17, "the MEI at a second" should read --the MTJ at a second--.

Signed and Sealed this
Seventeenth Day of July, 2018

Andrei Iancu
*Director of the United States Patent and Trademark Office*